United States Patent [19]
Schmied

[11] Patent Number: 4,566,742
[45] Date of Patent: Jan. 28, 1986

[54] CONSTRUCTION SET FOR THE ERECTION OF MOUNTING STRUCTURES

[75] Inventor: Samuel Schmied, Uetendorf, Switzerland

[73] Assignee: S. Schmied & Co., elektrotechnische Bedarfsartikel en gros, ASM-Tableaubau, Uetendorf, Switzerland

[21] Appl. No.: 568,640

[22] Filed: Jan. 6, 1984

[30] Foreign Application Priority Data

Jan. 10, 1983 [CH] Switzerland ............................ 108/83

[51] Int. Cl.⁴ .............................................. A47B 43/00
[52] U.S. Cl. .......................... 312/257 SK; 312/257 R
[58] Field of Search ..... 312/257 R, 257 SK, 257 SM, 312/257 A; 403/402, 295, 297, 403; 52/656, 475, 280, 288, 658

[56] References Cited

U.S. PATENT DOCUMENTS 3,779,177 12/1973 Gigante ................................ 312/257

FOREIGN PATENT DOCUMENTS

| 234348 | 6/1964 | Austria | 403/295 |
| 2731328 | 1/1979 | Fed. Rep. of Germany | |
| 2292357 | 6/1976 | France | |
| 327216 | 3/1958 | Switzerland | 312/257 SK |
| 455402 | 6/1967 | Switzerland | 403/402 |
| 581396 | 9/1976 | Switzerland | |

Primary Examiner—William E. Lyddane
Assistant Examiner—Joseph Falk
Attorney, Agent, or Firm—Wender Murase & White

[57] ABSTRACT

For the erection of frames and mounting structures for apparatuses there is provided a set of profiles with half open grooves. The grooves serve for the mutual assembly of the profiles by means of nuts and bolts which are introduced in the grooves. A ground profile is provided with grooves in such a way that further profiles may be easily secured at the desired levels. For realizing of corner joints, a corner angle piece is provided with inclined bolts acting toward the angle part of the angle piece and penetrating into the material of the profile.

13 Claims, 9 Drawing Figures

CONSTRUCTION SET FOR THE ERECTION OF MOUNTING STRUCTURES

BACKGROUND OF INVENTION

The present invention relates to a construction set for the erection of a mounting structure for various devices such as for example fuses or circuit breakers. The mounting structure comprises mounting members or profiles, fasteners such as nuts which cooperate with half open grooves of the profiles, and bolts for those nuts. Frame members or profiles with appropriate grooves for the direct determination of a height above a mounting base of the mounting member(s) for the particular devices and/or covering to be supported by the structure are provided, the frame profiles comprising two mutually perpendicular branches. Various sets of profiles are known, all of which may be used for the construction of an apparatus such as a cabinet frame which may be closed with a proper cabinet covering.

Various prior art construction sets are known. For example, German No. DE-A-2 731 328 discloses a box profile which comprise extensions at two adjacent box sides forming a half open groove. These extensions may serve for the fastening of mounting rails. Special wall, roof and floor elements must be mounted outside of the extensions.

Swiss No. CH-A-581 396 describes a box profile for forming frames at which the wall, roof and floor elements are fastened.

French Pat. No. 2 292 357 describes an angular box profile for erecting cabinet frames to which special wall and roof elements must be fastened. The profiles are not suited for a direct and simple installation of a mounting structure for various devices.

SUMMARY OF THE INVENTION

An object of the present invention is to provide a construction set having profiles or members which, instead of being used for erecting cabinet frames, permits a particularly simple erection of a mounting structure and/or cabinet for various devices, more particularly for electrical devices, and which may be directly mounted on a base, such as a wall. The construction set is adapted to require a minimum of and fasteners and contemplates use of the profiles for forming the cabinet walls. The construction set according to the invention is characterized in that a shorter branch of the frame members, provided for mounting on the base, comprises an inwardly looking open groove perpendicular to said shorter branch. The longer branch, near its extremity, includes an outwardly looking open groove, and within the outwardly looking open groove, an other open groove which is generally perpendicular with respect to the longer branch. The open groove looking inwardly from the base mounted shorter branch, permits direct fastening of mounting members or profiles at the desired height above the base, without requiring auxiliary devices except for fasteners such as the above-mentioned nuts and bolts. The longer branches of the ground profiles may serve directly as the outer walls of the cabinet or frame with their open grooves looking outwardly and upwardly respectively, to serve for fastening a covering thereon by means of a basic fastening means i.e., nuts and bolts. The inward looking open groove in the longer branch may serve for fastening partition profiles using means such as normalized angle pieces.

Preferably, particular frame profiles may be provided having a section corresponding to the part including the two grooves of the above-mentioned longer branch of the ground profile. This frame profile can be used as part of a wall in which a small space is formed between the frame profile and the base to provide an opening in which wiring may be disposed.

In accordance with other preferred aspects of the invention, the construction set may be utilized for a particularly simple construction of a cabinet accepting various devices. Such versatility has not been possible with previously known construction sets.

The invention will be described further by way of example and with reference to the accompanying drawings.

DESCRIPTION OF THE PREFERRED EMBODIMENTS

Figure 1:
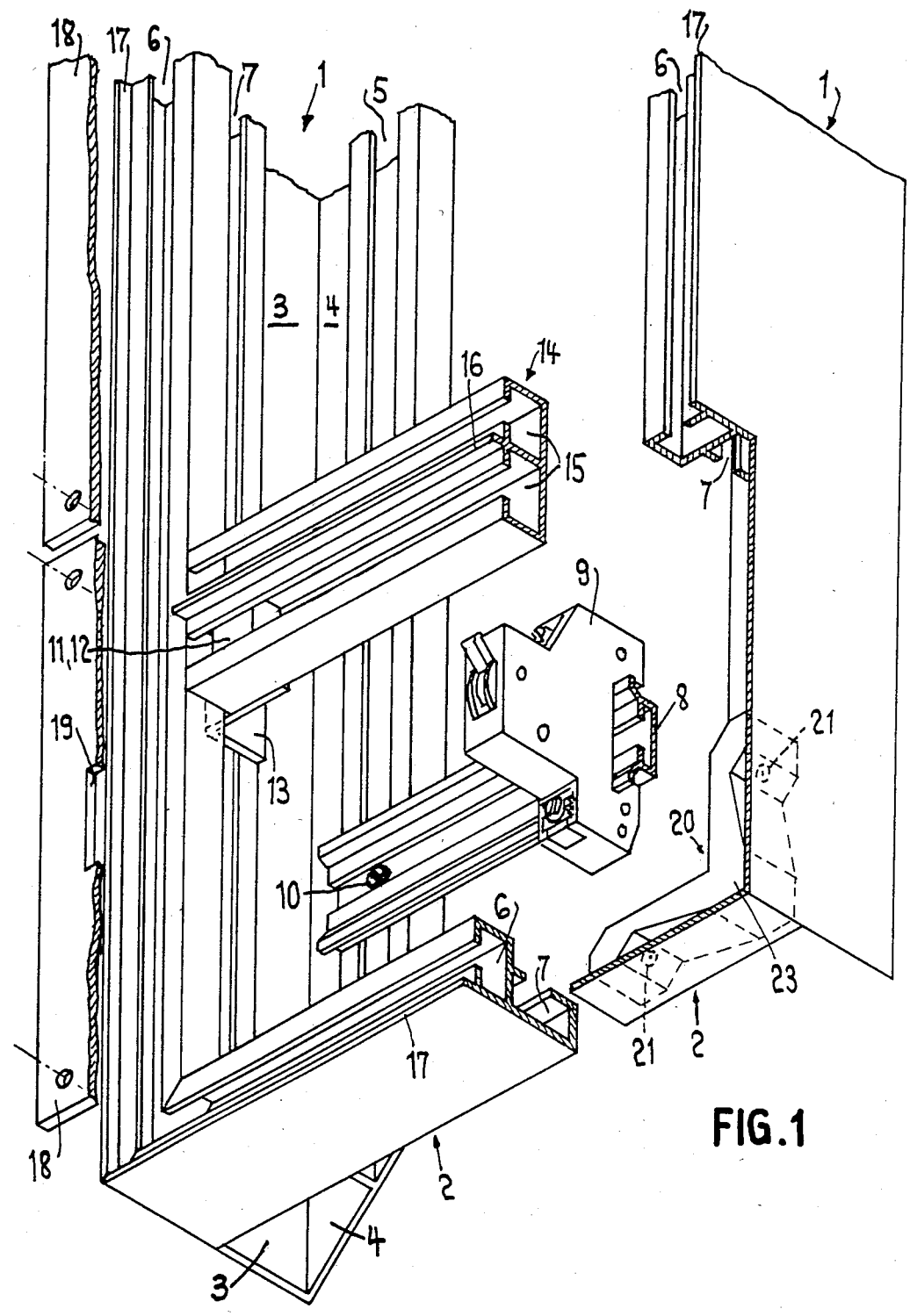
FIG. 1 illustrates a partially sectioned, perspective view of a part of a distribution box.
Figure 2:
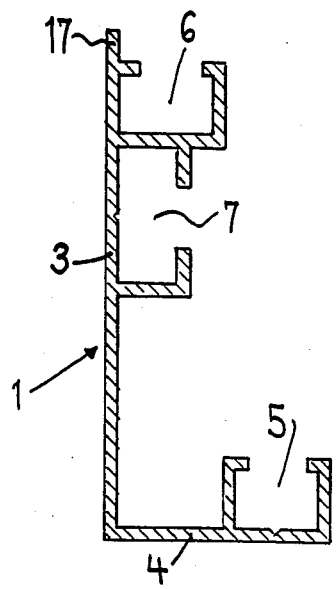
FIGS. 2 to 4 illustrate the frame member profiles of FIG. 1 in section.
Figure 3:
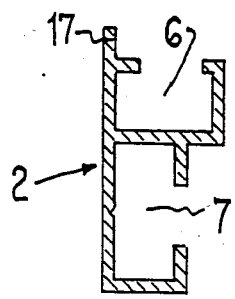

The distribution box illustrated in FIG. 1 comprises a frame, the lateral, perpendicular beams of which comprise of ground members or profiles 1 having a cross-section as illustrated in FIG. 2. A lower horizontal transverse beam comprises a member or profile 2 having a cross-section illustrated in FIG. 3. The upper horizontal transverse beam, not illustrated in FIG. 1, of the frame may comprise either a profile 1 or a profile 2.

The ground profile 1 has branches 3 and 4 which are preferably perpendicular to each other. In accordance with FIGS. 1 and 2, the branch 4 provides the means for mounting the frame on a base such as a wall (not illustrated). At the outer end of the branch 4, there is disposed a half-open groove 5 which opens in a direction perpendicular to the branch 4. A corresponding groove 6 having the same direction of opening and similar dimensions to groove 5 is provided at the upper end of the branch 3. A groove 7, having an opening perpendicular to the branch 3, is disposed immediately below the groove 6 as viewed in FIG. 2. The profile 2 (FIG. 3) includes a structure which corresponds to the upper part of the profile 1, specifically the grooves 6 and 7. The corresponding grooves of profiles 1 and 2 are designated by the same reference numerals.

As shown in FIG. 1, the lower grooves 5 serve as a site for the direct fastening of horizontally disposed normalized profiles 8, on which one or more devices, for example fuse elements or automatic cutouts 9, as illustrated in FIG. 1, can be mounted.

Figure 4:
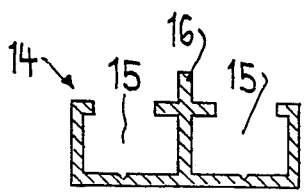
Figure 5:
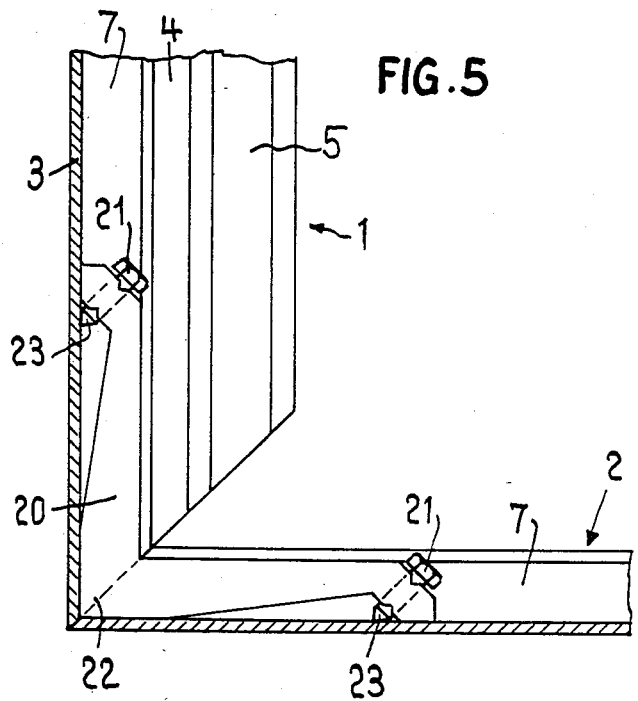
FIG. 5 is an elevational view illustrating a typical corner joint between the frame members of FIG. 1.
Figure 6:
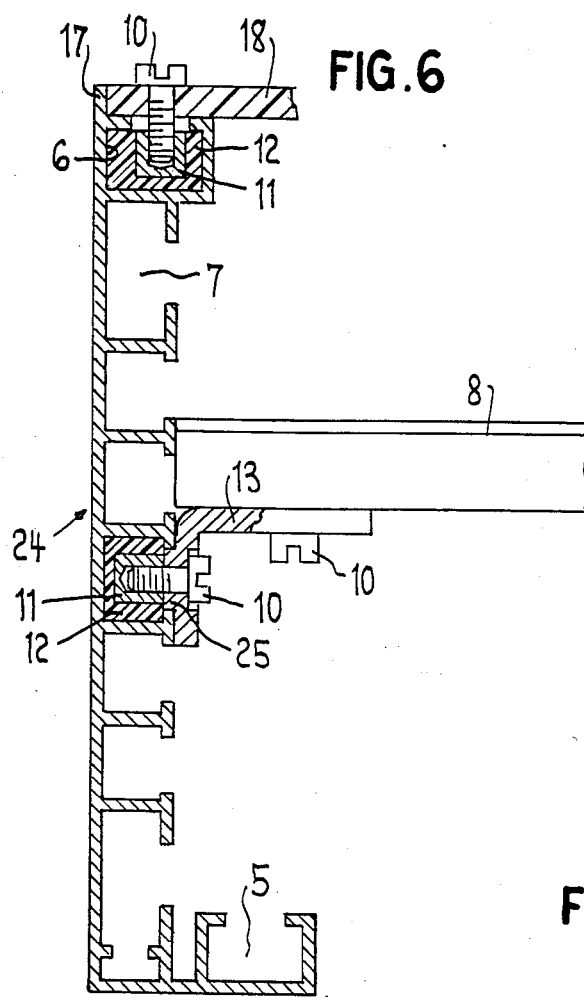
FIG. 6 illustrates a second embodiment of a ground profile with additional branches.

As best seen in FIG. 6, fasteners such as nuts 11 having a plastic shell 12 may be introduced in the grooves 5 of the lateral profiles 1 for accepting bolts 10 which traverse fastening openings in the profiles 8 in order to join the frame profiles 1 and mounting profiles 8. This kind of fastening may be universally employed. As best seen in FIG. 1, the depth of the upper side of the lateral flange of the profile 8 is determined by the groove 5 and choosen in such a way that a set of normalized profiles 8 will all be at the correct depth in the frame, with respect to the distribution boxes, without the need for any correction. Angle pieces 13 may be fastened by means of nuts 11, having plastic shells 12 which are introduced into opposing grooves 7 of the profile 1 to support a horizontally lying partition profile 14, a section of which is illustrated in FIG. 4. The profile includes two adjacent open grooves 15 which open in the same direction and which are separated by a traverse 16 which extends beyond the openings of the grooves 15. As indicated in FIG. 1, the grooves 15 are at about the same level as the grooves 6 of the profiles 1, and the traverse 16 of the profile 14 is at the same level as a traverse 17 which extends from the groove 6. The grooves 6 and 15 may serve to secure coverings 18 which may be formed as plates of plastic or other suitable material. As shown in FIG. 1, the coverings 18 may include appropriate windows 19 through which the devices 9 may project or be visible. The covering 18 may also be fastened and/or by means of nuts 11, having plastic shells 12 disposed in the grooves 6, and/or 15. Fastening the profiles 14 by means of the angle pieces 13 is also preferably accomplished by means of nuts 11, having plastic shells 12 and bolts 10.

As illustrated in FIGS. 1 to 5, in order to form the corner joint between a profile 1 and a profile 2, a joining angle piece 20 having bevelled ends may be introduced in the corresponding grooves 7. Inclined bolts 21, each having a point 23 looking toward the angle part 22 of the angle piece 20 are set up at the ends of the latter. After joining, the angle piece 20 is introduced. The bevelled front faces of the profiles to be joined are pushed against each other and the bolts 21 are tightened, their points 23 penetrating into the profile material, which is preferably made of aluminium, thereby pressing the profiles against each other and holding them together in an abutting position. This forms a perfect corner joint in a simple and rapid manner.

In accordance with FIG. 1, an opening may be provided between the profile 2 and the base or surface to which the mounting structure is attached. This opening permits wires, tubes, cables and/or similar elements to be introduced into the box. If all cables and pipes are buried, it is possible to use a profile 1 instead of a profile 2 in order to obtain a frame or a box completely closed with respect to the mounting base.

As indicated from the preceding description, an entire frame or box may be formed using only the profiles 1, 2 and 14, the universally used normalized mounting profile 8, the universally used nuts 11, 12 and bolts 10, and angle pieces 13. Installations of distribution boxes of whatever dimensions required, may be erected in a rational manner, using only a few simple construction parts. Particular adapting labors are not required.

FIG. 6 illustrates a second embodiment which includes a ground profile 24 similar to the profile 1 of FIG. 1 and includes mutually branches having grooves 5, 6 and 7 corresponding to the similarly referenced grooves of FIGS. 1 and 2. However, the profile 24 is deeper than the profile 1 so that normalized profiles 8 may be set up at various depth levels. As may be seen from FIG. 6, in this embodiment the angle piece 13 is shaped in order to form a projection 25 which engages the groove opening such that the position of the angle piece is precisely determined. FIG. 6 also illustrates the fastening of a cover or roof plate 18.

Figure 7:
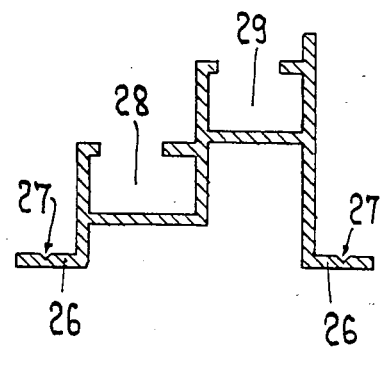
FIGS. 7 and 8 illustrate profiles for direct mounting in an existing distribution box.
Figure 8:
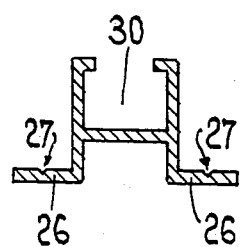

FIGS. 7 and 8 illustrate profiles which may be mounted to the base or floor of existing distribution boxes or the like. These profiles of FIGS. 7 and 8 each include two lateral flanges 26, preferably having piercing grooves 27 for applying a drill in order to produce fastening openings. A profile in accordance with FIG. 7 comprises two staggered grooves 28 and 29 for fastening mounting profiles or the like at desired levels or depths in a cabinet. A profile in accordance with FIG. 8 comprises a single groove 30 for the fastening of further profiles, such as normalized mounting profiles, at the appropriate depth in the distribution box.

Different embodiments are possible. The corner joints may be formed in another more conventional manner. On the other hand, the illustrated and described corner joint may be also used advantageously for completely different aims.

Figure 9:
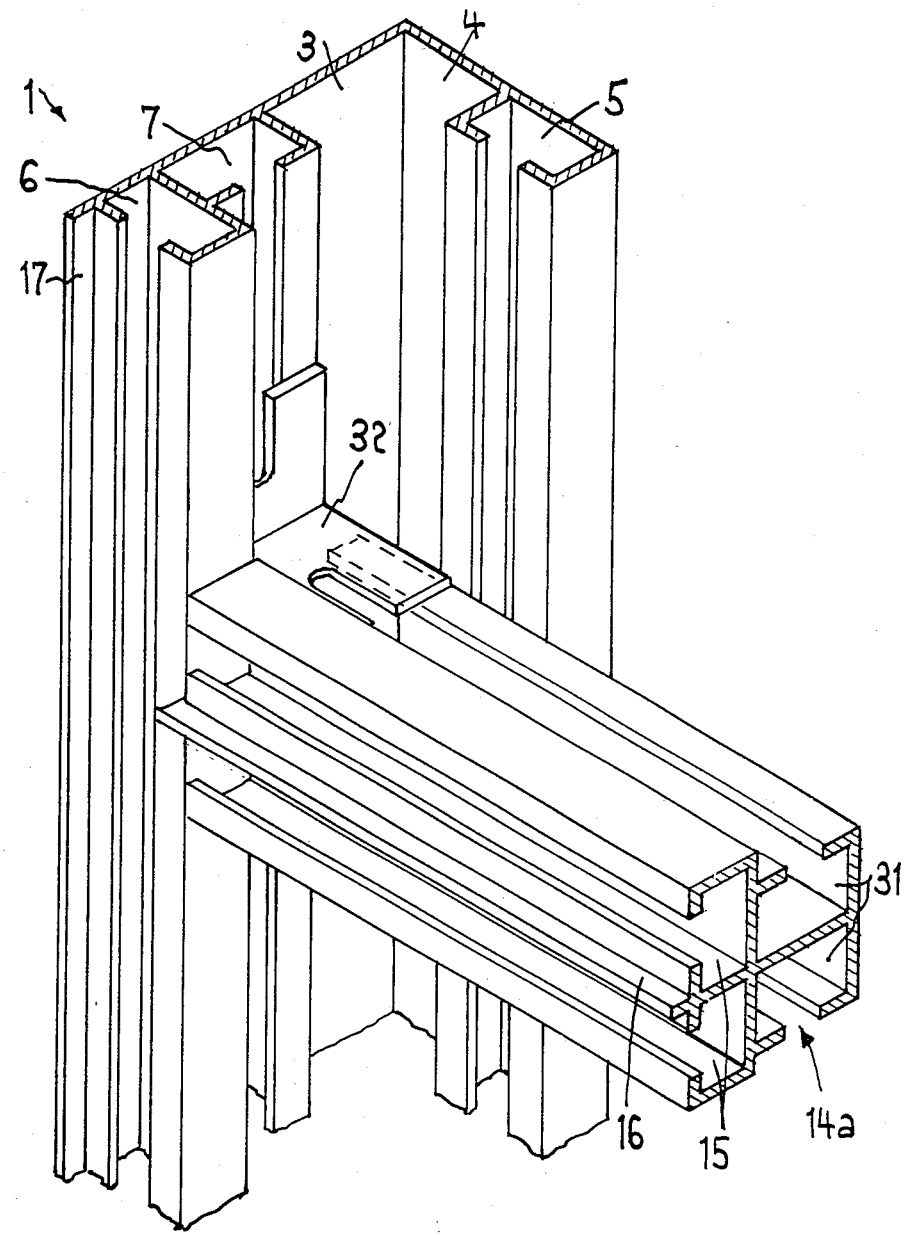
FIG. 9 is a partial perspective view, illustrating a variation on the profiles of FIG. 4 in section.

FIG. 9 shows an advantageous variant 14a of the partition profile 14 of FIG. 4. The profile 14a comprises, at the back of the grooves 15, two symetrically disposed grooves 31 which open in opposite directions. The openings of the grooves 31 face in a direction perpendicular to the openings of the grooves 15. While in the profile 14 of FIG. 1, openings must be drilled for fastening this profile with the ground profile 1 by means of angle pieces 13, the profile 14a can be fastened with the ground profile 1 by means of angle pieces 32 without drilling openings. However, the grooves 31 may also serve other aims, such as for the fastening of struts, supports or the like.

I claim:

1. A construction set for erecting a mounting structure, comprising first wall-forming members having a cross-section which includes first and second branches and a corner, said first and second branches extending from said corner in mutually perpendicular directions, said second branch being longer than said first branch and forming a wall of said mounting structure, said first branch extending generally parallel to a first plane and including a groove having an opening directed generally orthogonally with respect to said first plane, said second branch extending generally parallel to a second plane and having a first groove with an opening directed generally parallel with respect to said second plane and a second groove disposed between the first groove and said corner, said second groove having an opening directed generally orthogonally with respect to the second plane, mounting members operable for mounting a first means on said mounting structure by means of fasteners, wherein the groove of said first branch is positioned to support said mounting members at a predetermined depth in said mounting structure.

2. The construction set according to claim 1, further comprising a second wall-forming member having a cross-section of which corresponds to the cross-section of that portion of said second branch of the first wall-forming member which includes said first and second grooves.

3. The construction set according to claim 1 further comprising a partition member extending generally parallel to a third plane and having a pair of grooves with openings directed generally parallel with respect to said third plane, and a traverse extending beyond said openings in a direction orthongonal to said third plane, said partition member being mounted with said pair of grooves disposed at the same depth in said mounting structure as the first groove of said second branch of the first wall-forming member.

4. The construction set according to claim 3, further comprising an angle piece operable for joining either said mounting member or said partition member to said first wall-forming member.

5. The construction set according to claim 1, further comprising a first auxiliary member having two lateral mounting branches and a groove, the groove of said auxiliary member having an opening directed generally orthogonally with respect to a plane extending generally parallel with respect to said mounting branches.

6. The construction set according to claim 1, further comprising a second auxiliary member having two lateral mounting branches and at least two grooves arranged between said mounting branches, each of the grooves of the second auxiliary member having openings directed generally orthogonally with respect to a plane extending generally parallel with respect to said mounting branches, said grooves being at different depths relative to said last mentioned plane.

7. The construction set according to claim 1, further comprising a joining angle for assembling wall-forming members, said joining angle having means for cooperating with said wall forming members, and means, cooperating with said joining angle, for pressing adjacent wall-forming members against each other.

8. The construction set according to claim 1 wherein said first means comprises a cover plate.

9. The construction set according to claim 1 wherein said first means comprises an electrical device.

10. A mounting structure adapted to be attached to a base, said mounting structure comprising first wall-forming members having a cross-section which includes first and second branches and a corner, said first and second branches extending from said corner in mutually perpendicular directions, said first branch being adapted to bear against said base, said second branch forming a wall of said mounting structure, said first branch having a groove with an opening directed generally orthogonally with respect to a plane extending generally parallel with respect to said first branch, said second branch having a first groove with an opening directed generally parallel with respect to a plane of said second branch and a second groove disposed between the first groove and said corner and having an opening directed generally othogonally with respect to the plane of said second branch, mounting members operable for mounting a first means on said mounting structure, said groove of said first branch including means for fixing said mounting members at a level above said base directly determined by said first wall-forming member.

11. The structure according to claim 10, wherein at least one wall of the mounting structure is formed by a second wall-forming member operable to cooperate with said first wall-forming members to provide an access opening into the mounting structure between the base and the second wall-forming member.

12. The construction set according to claim 10 wherein said first means comprises a cover plate.

13. The construction set according to claim 10 wherein said first means comprises an electrical device.

* * * * *